(12) United States Patent
Pawlowski et al.

(10) Patent No.: US 9,894,437 B2
(45) Date of Patent: Feb. 13, 2018

(54) MICROPHONE ASSEMBLY WITH PULSE DENSITY MODULATED SIGNAL

(71) Applicant: Knowles Electronics, LLC, Itasca, IL (US)

(72) Inventors: Andrzej Pawlowski, Virum (DK); Kasper Strange, Copenhagen (DK); Kim Spetzler Berthelsen, Koge (DK); Henrik Thomsen, Holte (DK)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 15/428,050

(22) Filed: Feb. 8, 2017

(65) Prior Publication Data

US 2017/0230750 A1     Aug. 10, 2017

Related U.S. Application Data

(60) Provisional application No. 62/293,072, filed on Feb. 9, 2016.

(51) Int. Cl.
*H04R 3/00*      (2006.01)
*G10L 21/0232*   (2013.01)
*H04R 1/08*      (2006.01)
*H04R 19/04*     (2006.01)
*G10L 21/0216*   (2013.01)

(52) U.S. Cl.
CPC .......... *H04R 3/002* (2013.01); *G10L 21/0232* (2013.01); *H04R 1/08* (2013.01); *H04R 19/04* (2013.01); *G10L 2021/02163* (2013.01); *H04R 2201/003* (2013.01); *H04R 2410/03* (2013.01)

(58) Field of Classification Search
CPC . H04R 19/04; H04R 1/04; H04R 1/08; H04R 3/00; H04R 3/002; H04R 2201/003; H04R 2410/03; H04R 25/505; G06F 3/162; G10L 2021/02163; G10L 21/0232
See application file for complete search history.

(56) References Cited

U.S. PATENT DOCUMENTS

| | | |
|---|---|---|
| 5,822,598 A | 10/1998 | Lam |
| 6,070,140 A | 5/2000 | Tran |
| 6,154,721 A | 11/2000 | Sonnic |
| 6,249,757 B1 | 6/2001 | Cason |
| 6,397,186 B1 | 5/2002 | Bush et al. |
| 6,756,700 B2 | 6/2004 | Zeng |
| 7,415,416 B2 | 8/2008 | Rees |
| 7,774,204 B2 | 8/2010 | Mozer et al. |

(Continued)

*Primary Examiner* — Thang Tran
(74) *Attorney, Agent, or Firm* — Foley & Lardner LLP

(57) ABSTRACT

The disclosure relates to a microphone assembly comprising a multibit analog-to-digital converter configured to receive, sample, and quantize a microphone signal to generate N-bit digital microphone samples representative of the microphone signal at a first sampling frequency. The microphone assembly also comprises a first digital-to-digital converter configured to receive, quantize, and noise-shape the N-bit digital microphone samples to generate a corresponding M-bit Pulse Density Modulated (PDM) signal, wherein N and M are positive integers, and N>M. The microphone assembly may comprise a SoundWire compliant data interface configured to repeatedly receive samples of the M-bit PDM signal and write bits of the M-bit PDM signal to a SoundWire data frame.

22 Claims, 6 Drawing Sheets

(56) References Cited

U.S. PATENT DOCUMENTS

| | | |
|---|---|---|
| 7,957,972 B2 | 6/2011 | Huang et al. |
| 8,275,148 B2 | 9/2012 | Li et al. |
| 8,666,751 B2 | 3/2014 | Murthi et al. |
| 8,972,252 B2 | 3/2015 | Hung et al. |
| 8,996,381 B2 | 3/2015 | Mozer et al. |
| 9,043,211 B2 | 5/2015 | Haiut et al. |
| 9,112,984 B2 | 8/2015 | Sejnoha et al. |
| 2006/0074658 A1 | 4/2006 | Chadha |
| 2012/0232896 A1 | 9/2012 | Taleb et al. |
| 2012/0310641 A1 | 12/2012 | Niemisto et al. |
| 2013/0216076 A1* | 8/2013 | Knudsen .............. H04R 25/558 381/312 |
| 2013/0223635 A1 | 8/2013 | Singer et al. |
| 2014/0112501 A1* | 4/2014 | Yeh ..................... H04R 3/00 381/122 |
| 2014/0163978 A1 | 6/2014 | Basye et al. |
| 2014/0244269 A1 | 8/2014 | Tokutake |
| 2014/0254837 A1* | 9/2014 | Mortensen .............. H03F 3/187 381/120 |
| 2014/0257821 A1 | 9/2014 | Adams et al. |
| 2014/0274203 A1 | 9/2014 | Ganong et al. |
| 2014/0278435 A1 | 9/2014 | Ganong et al. |
| 2014/0281628 A1 | 9/2014 | Nigam et al. |
| 2014/0334643 A1* | 11/2014 | Pinna .................... H03G 3/301 381/107 |
| 2014/0343949 A1 | 11/2014 | Huang et al. |
| 2015/0106085 A1 | 4/2015 | Lindahl |
| 2015/0112690 A1 | 4/2015 | Guha et al. |
| 2015/0134331 A1 | 5/2015 | Millet et al. |
| 2015/0350772 A1* | 12/2015 | Oliaei ..................... H04R 1/04 381/111 |
| 2016/0344358 A1* | 11/2016 | Oliaei ..................... H04R 1/08 |
| 2017/0154620 A1* | 6/2017 | Berthelsen ............. G10L 15/16 |

\* cited by examiner

FIG. 3

MICROPHONE ASSEMBLY WITH PULSE DENSITY MODULATED SIGNAL

CROSS REFERENCE TO RELATED APPLICATIONS

The present application claims priority to U.S. Provisional Patent Application No. 62/293,072 filed on Feb. 9, 2016, the entirety of which is incorporated by reference herein.

TECHNICAL FIELD

This application relates to microphone assemblies and, more specifically, to microphone assemblies having digital converters.

BACKGROUND

Miniature digital microphones are known and offer many benefits such as providing better signal-to-noise ratio and RF immunity than their analog counterparts on a system level making the digital microphones interesting and attractive for numerous applications such as portable communication devices including cellular phones and smartphones etc. Portable communication devices are compact devices which are powered from rechargeable battery sources. The compact dimensions and reliance on battery sources both impart severe constraints on the maximum acceptable dimensions and power consumption of microphones and microphone amplification circuit utilized in such portable communication devices.

Furthermore, microphones disposed in portable communication devices often comprise a standardized data interface to the host processor of the communication device to ensure compatibility with this interface.

However, known digital microphones add a significant time delay or latency to the sound signal picked-up by the microphone transducer. This time delay is typically imparted by various digital processing circuits of the microphone such as sigma-delta converters (ΣΔ) and their associated noise-shaping and decimation filters, data interface handling etc.

The time delay or latency added to the audio signal by known digital microphones represents a significant problem for numerous types of applications in portable communication devices such as automatic noise cancellation, feedback suppression, echo cancellation etc.

SUMMARY

In accordance with some aspects of the present disclosure, a microphone assembly is disclosed. The microphone assembly includes a transducer configured to convert sound into electrical signal. The microphone assembly also includes an electrical circuit having a multibit analog-to-digital converter coupled to an output of the transducer, the analog-to digital converter configured to receive, sample, and quantize the electrical signal to generate N-bit digital samples representative of the electrical signal. The microphone assembly further includes a first digital-to-digital converter including a first quantizer and a first integrator coupled to an output of the first quantizer, such that the first digital-to-digital converter is configured to quantize and noise-shape N-bit digital samples to generate a corresponding M-bit Pulse Density Modulated (PDM) signal based on a difference between the N-bit digital samples and a first feedback signal from the first integrator, where N and M are positive integers and N>M. The microphone assembly also includes a processor configured to control performance of the microphone assembly by configuring the first digital-to-digital converter with configuration information stored in a register of the electrical circuit, a control interface over which configuration information in the register may be written and read, and a physical interface having contacts coupled to the electrical circuit.

In accordance with some other aspects of the present disclosure, an electrical circuit for a microphone assembly is disclosed. The electrical circuit includes a multibit analog-to-digital converter configured to generate N-bit digital samples representative of the electrical signal, the electrical signal representative of acoustic activity detected by an electro-acoustic transducer. The electrical circuit also includes a first digital-to-digital converter including a first quantizer and a first noise-shaping integrator coupled to an output of the first quantizer, such that the first digital-to-digital converter is configured to quantize and noise-shape N-bit digital samples to generate a corresponding M-bit Pulse Density Modulated (PDM) signal based on a difference between the N-bit digital samples and a first feedback signal from the first noise-shaping integrator, wherein N and M are positive integers and N>M. The electrical circuit additionally includes a processor configured to configure the first digital-to-digital converter using configuration information stored in a register of the electrical circuit, and a control interface coupled to the register wherein configuration information may be written to and read from the register via the control interface.

In accordance with yet other aspects of the present disclosure, a method in an acoustic microphone assembly having a transducer and an electrical circuit disposed in a housing having a physical interface is disclosed. The method includes converting sound into an electrical signal using the transducer, generating N-bit digital samples representative of the electrical signal using an analog-to-digital converter of the electrical circuit, and generating a M-bit Pulse Density Modulated (PDM) signal, where N and M are positive integers and N>M, by quantizing noise-shaped N-bit digital samples using a first digital-to-digital converter. The method also includes controlling performance of the microphone assembly by configuring the first digital-to-digital converter with configuration information read from a register of the microphone assembly, and providing a PDM signal to the physical interface.

BRIEF DESCRIPTION OF THE DRAWINGS

Embodiments of the present disclosure are described in more detail below in connection with the appended drawings in which:

FIG. 3 is a graphical illustration the SoundWire data frame according to the first embodiment overlaid with M-bit samples of a PDM signal representative of a microphone signal.

Figure 1:
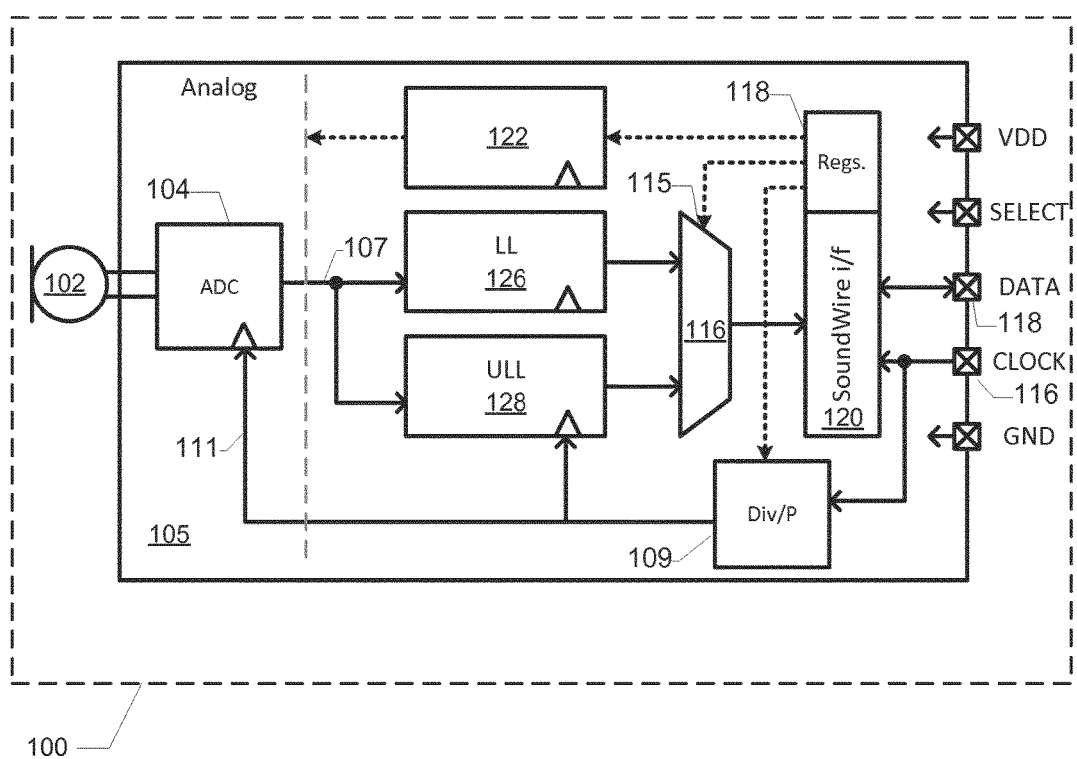
FIG. 1 shows a schematic block diagram of a microphone assembly comprising a data interface according to various embodiments of the present disclosure.

The skilled artisans will appreciate that elements in the appended figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Approaches, microphone assemblies and methodologies are described herein that are configured to converting an analog microphone signal into a Pulse Density Modulated (PDM) signal with low latency. The microphone assembly may comprise a digital-to-digital converter configured to receive, quantize, and noise-shape N-bit digital microphone samples, representative of the analog microphone signal, to a corresponding single-bit or M-bit Pulse Density Modulated (PDM) signal, wherein N and M are positive integers and N>M.

The present disclosure relates to a microphone assembly comprising a multibit analog-to-digital converter configured to receive, sample and, quantize a microphone signal to generate a N-bit digital microphone samples representative of the microphone signal at a first sampling frequency. The microphone assembly comprises a first digital-to-digital converter configured to receive, quantize and noise-shape the N-bit digital microphone samples to generate a corresponding M-bit Pulse Density Modulated (PDM) signal, wherein N, and M are positive integers and N>M. The microphone assembly may also comprise a data interface configured to repeatedly receive samples of the PDM signal and write the bits of the PDM signal to a data frame.

In one implementation, the data interface is compliant with the SoundWire$^{SM}$ v1.0 specification adopted by the MIPI® Alliance or a future officially adopted version of the SoundWire$^{SM}$ specification. According to this implementation, bits of the PDM signal are written to respective frame columns of a pre-determined frame row of a SoundWire data frame. The SoundWire compliant data interface may comprise a digital processor for example embodied as a digital state machine and/or a software programmable microprocessor such as a digital signal processor (DSP). Other interfaces could be used alternatively.

The microphone transducer element may comprise a capacitive microphone for example comprising a microelectromechanical (MEMS) transducer element. The capacitive microphone may comprise a diaphragm and backplate either permanently polarized or polarized by a DC bias voltage supply supplied by the microphone assembly. The microphone transducer element may comprise an electret transducer with permanent polarization of a diaphragm and backplate. The microphone assembly may be shaped and sized to fit into portable audio and communication devices such as smartphones, tablets and mobile phones etc. The transducer element may be responsive to impinging audible sound within a frequency range 20 Hz-20 kHz or at least with the range 100 Hz-10 kHz.

The multibit analog-to-digital converter preferably comprises at least one of: a flash converter, a single-bit sigma-delta modulator followed by a decimator and a multi-level sigma-delta modulator. The multi-level sigma-delta modulator may comprise 3 and 16 different levels defined by a multilevel quantizer to provide 2-4 bits digital microphone samples, i.e., N=2, 3 or 4. The first sampling frequency of the multi-level sigma-delta modulator may be set to provide the N-bit digital microphone samples at an oversampled rate relative to the audio band. The first sampling frequency may be between 1.2 MHz and 6.144 MHz including the latter frequencies.

The value of M is at least one unit smaller than the value of N to provide signal quantization in the first digital-to-digital converter—for example M=N−1 or M=N−2 or M=N−3. In certain embodiments, M=1 to write a single-bit Pulse Density Modulated signal to the data interface and N may have a value of 5, 4, 3 and 2.

The first digital-to-digital converter may comprise a noise-shaping feedback loop with an integration of order one, two, three or four or even higher, as discussed in additional detail below with reference to the appended drawings, for performing the noise-shaping of the N-bit digital microphone samples.

A third aspect of the disclosure relates to a semiconductor die comprising the processing circuit according to any of the above-described embodiments thereof. The processing circuit may comprise a CMOS semiconductor die. The processing circuit may be shaped and sized for integration into a miniature MEMS microphone housing or package.

A fourth aspect of the disclosure relates to a portable communication device comprising a transducer assembly according to any of the above-described embodiments. The portable communication device may comprise an application or host processor, e.g., a microprocessor such as a Digital Signal Processor. The application processor may comprise a SoundWire compliant data interface connected to the SoundWire compliant data interface via a common SoundWire bus. Various types of configuration data of the processing circuit may be transmitted by the host processor to a system controller and its associated system registers via the SoundWire compliant data interface. The configuration data of the processing circuit of the microphone assembly may for example comprise a device sampling frequency, a unique device ID and configuration of the SoundWire data frame as discussed in further detail below with reference to the appended drawings.

FIG. 1 shows an exemplary embodiment of a microphone assembly or system 100 in accordance with the present disclosure. The microphone assembly 100 comprises a transducer element 102 (e.g., a microelectromechanical system (MEMS) transducer with a diaphragm and back plate) configured to convert incoming sound into a corresponding analog microphone signal. The transducer element 102 may for example comprise a miniature condenser microphone or a miniature electret microphone element. The analog microphone signal generated by the transducer element 102 in response to impinging sound may be electrically coupled to a processing circuit 105 via bonding wires and/or pads. The microphone assembly 100 may comprise a housing (not shown) supporting, enclosing and protecting the transducer element 102 and the processing circuit 105 of the assembly 100 against the external environment. The housing may comprise a sound inlet or sound port conveying sound waves to the transducer element 102. The processing circuit 105 may comprise a CMOS semiconductor die for example an ASIC. The processing circuit 105 may be shaped and sized for integration into a miniature MEMS microphone housing or package. The processing circuit 105 comprises a DC power supply input via pads or terminals VDD and GND. The skilled person will understand the processing circuit 105 may comprise various voltage regulators and supplies (not shown) generating appropriate DC supply voltages to the circuit blocks of the processing circuit 105 discussed below.

The processing circuit 105 comprises a multibit analog-to-digital converter 104 coupled to an output of the transducer element 102, for example through a DC blocking or ac coupling capacitor, for receipt of the analog microphone signal produced by the transducer element 102. Some embodiments of the processing circuit 105 may comprise a microphone preamplifier (not shown) inserted in the signal path between the transducer element 102 and the input of the multibit analog-to-digital converter 104 to amplify and/or buffer the analog microphone signal before applying the latter to the input of the multibit analog-to-digital converter 104. The skilled person will understand such an optional preamplifier may be integrated with the analog-to-digital converter 104 in other embodiments of the present disclosure.

The multibit analog-to-digital converter 104 produces a multibit digital signal or stream of multibit microphone samples representative of the analog microphone signal. The analog-to-digital converter 104 may comprise a multi-level sigma-delta converter (ΣΔ) or modulator or a flash converter. The multi-level sigma-delta converter (ΣΔ) may be clocked at a first oversampled sampling frequency or rate—for example a sampling frequency between 1.2 MHz and 3.072 MHz. A programmable clock divider 109 may be configured to derive an appropriate internal clock signal 111 from a clock input of a SoundWire interface 120 of the processing circuit 105. The internal clock signal 111 sets the device sample rate or frequency of the multibit analog-to-digital converter 104 and hence the clock frequency of various other circuit blocks such as a first digital-to-digital converter 128 exhibiting ultra-low latency and a second digital-to-digital converter 126 as discussed in further detail below. A clock signal of the SoundWire bus is applied to a clock input or terminal 116 (CLOCK) of the SoundWire interface 120. The clock signal of the SoundWire bus is applied to an input of the programmable clock divider 109 and divided with a programmable integer number to derive the internal clock signal 111. The programmable clock divider 109 may for example be configured to divide the clock signal of the SoundWire bus by an integer number P selected from a group of {2, 4, 6, 8, 10, 12, 14, 16} by appropriate control of the corresponding settings of a system control register 118 associated with a system controller 122 of the processing circuit 105. The SoundWire bus supports several standardized clock frequencies such as 19.2 MHz and 6.144 MHz which conveniently can be reduced to common digital audio sampling frequencies such as 48 kHz using an integer clock division scheme. The device sample rate may for example be set to 3.072 MHz or 2.4 MHz.

If the analog-to-digital converter 104 comprises a multi-level sigma-delta converter the latter may be configured to generate multibit samples comprising a relatively small number of bits, such as between 2 and 5 bits, to limit circuit complexity of the multi-level sigma-delta converter.

The present embodiment of the processing circuit 105 comprises the first digital-to-digital converter 128 and the second digital-to-digital converter 126 arranged in parallel in the microphone signal path of the circuit 105, i.e., both connected to the output of the analog-to-digital converter 104 for receipt of the stream of multibit samples representative of the analog microphone signal. The first digital-to-digital converter 128 is configured to receive, quantize and noise-shape the multibit microphone samples to generate a corresponding M-bit Pulse Density Modulated (PDM) signal where the number of bits of the PDM signal is smaller than the number of bits of the multibit microphone samples. Hence, if multibit microphone samples comprise N bits where N is a positive integer, the PDM signal comprises M bits where M is a positive integer smaller than N. If N is set to 5, then M may be 2, 3 of 4. This quantization process carried out by the first digital-to-digital converter 128 leads to the introduction of quantization noise in the PDM signal which however is suppressed in the audio band by a noise-shaping loop of the first digital-to-digital converter 128 as discussed in further detail below. The second digital-to-digital converter 126 is configured to receive, quantize and noise-shape the multibit microphone samples to generate a corresponding single-bit Pulse Density Modulated (PDM) signal where the single bit PDM signal has fewer bits than the number of bits of the multibit microphone samples. Hence, as mentioned above the multibit microphone samples may each comprise N bits where N is a positive integer and these N bits of each multibit microphone sample is reduced to a single bit representation at the output of the second digital-to-digital converter 126. This level quantization process carried out by the second digital-to-digital converter 126 also leads to the introduction of a significant level of quantization noise in the single-bit PDM signal. This quantization noise is, however, suppressed within the audio band by a noise-shaping loop of the second digital-to-digital converter 126 as discussed in further detail below.

The single-bit PDM signal is applied to a first input of a multiplexer 116 and the multibit PDM signal is applied to a second multiplexer input. The multiplexer 116 is therefore configured to selectively transmit one of the single-bit PDM signal and the multibit PDM signal to an input of the SoundWire compliant data interface 120 in accordance with a setting or state of a select input 115 of the multiplexer 116. The setting or state of a select input 115 may be controlled by a register setting of the system control register 118. The SoundWire compliant data interface 120 is configured to repeatedly receive the incoming samples of the PDM signal and structure and time these according to the interface configuration as set or defined by the system controller 120. In one embodiment of the present disclosure, the SoundWire compliant data interface 120 is configured to write the bits of each sample of the multibit PDM signal to respective frame columns of a predetermined frame row of a SoundWire data frame. This feature is described in further detail below with reference to FIG. 2 graphically illustrating the structure of a SoundWire data frame. The SoundWire compliant data interface 120 finally writes the samples of the multibit PDM signal to an externally accessible data pad or pin (DATA) 118 of the processing circuit 105 for application to the SoundWire data bus and transmission to the previously discussed host processor coupled to the SoundWire bus.

While the present embodiment of the processing circuit 105 comprises both the first digital-to-digital converter 128 and the second digital-to-digital converter 126, which may be working in parallel, the skilled person will appreciate that other embodiments of the present microphone assembly 100 may comprise only one of the first and second digital-to-digital converters 128, 126. In the latter embodiments, the multiplexer 116 may be eliminated.

Various device settings and configurations of the microphone assembly 100 are controlled by the system controller 122 and settings may be stored in non-volatile memory of the system registers 118. The device settings and configurations may be controlled by the host processor, such as a DSP or microprocessor of the portable communication device, by writing appropriate data commands to the system controller 122 through the bi-directional DATA port of the SoundWire compliant data interface 120 using the SoundWire bus. The device settings and configurations of the assembly 100 may comprise a division ratio P of the clock divider 109 as discussed above. The device settings and configurations may be used to set respective orders of noise-shaping loops of the first and second digital-to-digital converters 128, 126.

The system controller 122 and associated registers 118 may be used to set the number of channels, sample width, sample interval, HStart, Hstop (Number of frame columns −1) and the block offset of each microphone assembly (e.g., 1, 4 and 7). The system controller 122 and associated system registers 118 may support banked settings which has the advantage that each individual register exists in at least two banks, a bank 0 and a bank 1. This feature enables synchronized switching between bank 0 and bank 1 settings across all slaves, e.g. comprising multiple microphone assemblies, on the SoundWire bus thereby achieving the benefit of seamless and simultaneous mode changes with a minimum of audible or measureable artifacts.

The system registers 118 may be used to store other types of useful device information such as a Device ID, a Device Number, Banked Row and Column SoundWire frame control registers, Interrupt registers, and PDM bit size value among other data. The Device ID may provide a unique identification of multiple identical microphones assemblies connected on the same SoundWire bus.

Figure 2:
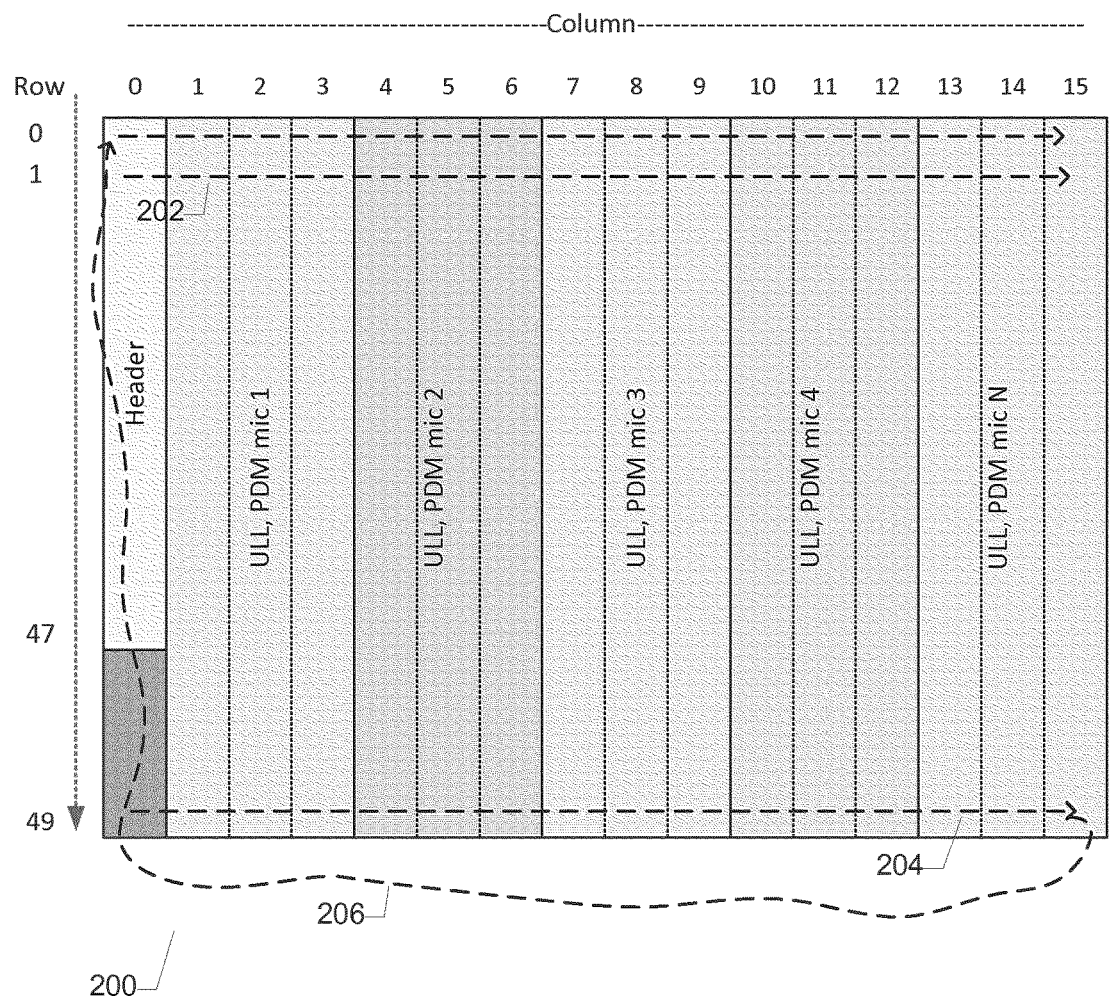
FIG. 2 is a graphical illustration of a SoundWire data frame according to a first embodiment of the present disclosure.

FIG. 2 is a schematic illustration of the structure of an exemplary SoundWire data frame 200 in accordance with a first embodiment of the present disclosure. The SoundWire data frame comprises 16 adjacently arranged frame columns 0-15 and 50 frame rows 0-49. Each of the frame columns, or several designated adjacent frame columns, carries the data bits of a particular microphone assembly onto the SoundWire bus. The number of allocated frame columns of SoundWire data frame 200 of a particular transducer is often designated "sample width" and may be programmed or set by the previously discussed system controller 122. Likewise, the number of frame columns may be set or programmed by the system controller 122 within the upper limit of 16 columns set by the SoundWire standard. The illustrated exemplary SoundWire data frame 200 carries respective PDM signal data of 5 separate microphone assemblies coupled to a common or shared SoundWire bus of the host processor. The SoundWire compliant data interface 120 is configured to sequentially transmit consecutive bits of the each frame row onto the SoundWire data bus via the bi-directional data pad 118. Once, data bits of a particular frame row have been transmitted, the interface reverts to column 0 of the subsequent frame row and transmits the data bits of the latter and so on until the entire SoundWire data frame 200 has been traversed—at column 15 and row 49 in this embodiment. This order of transmission has been schematically indicated by the sequence arrows 202, 204, 206.

Figure 3:
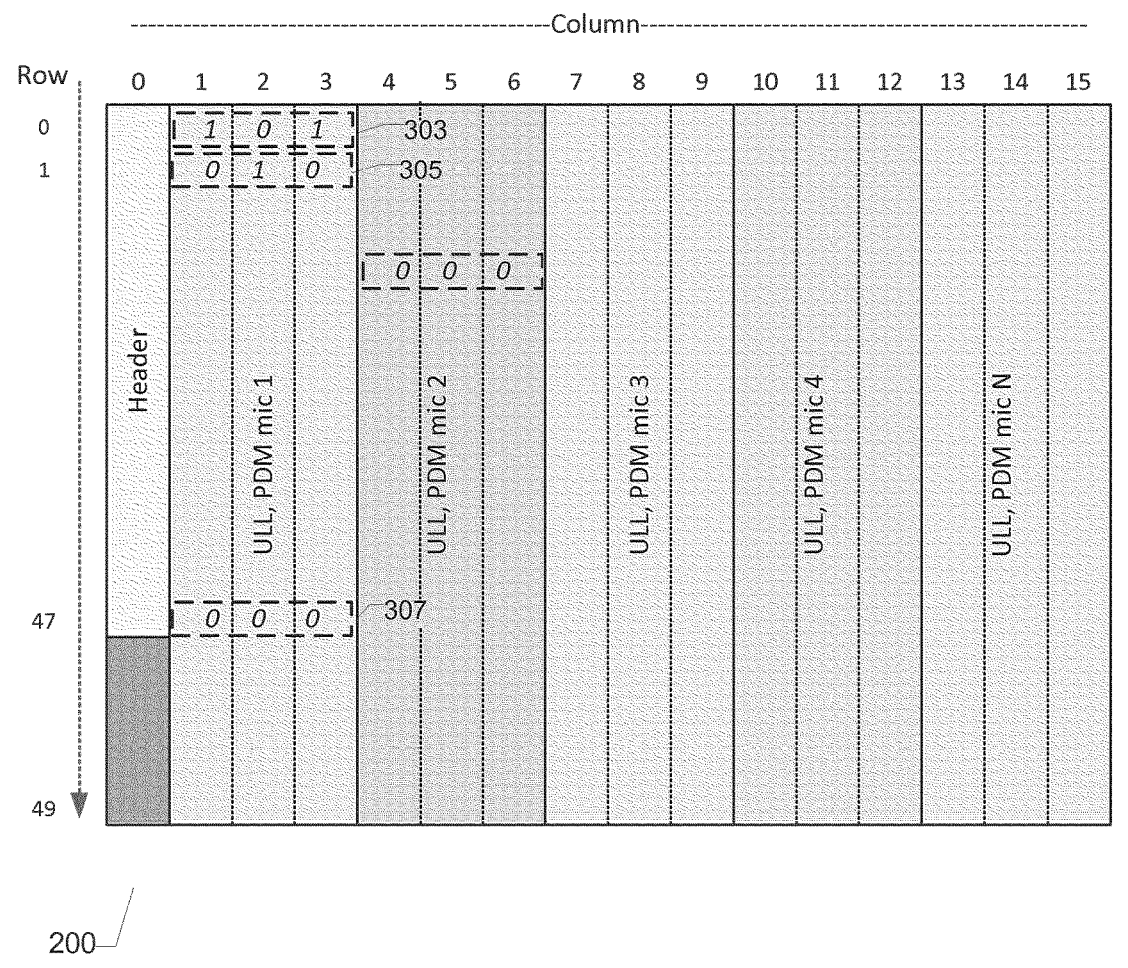

FIG. 3 is a schematic illustration of the same exemplary SoundWire data frame 200 discussed above in connection with FIG. 2, but individual bits of the multibit PDM signal (N=3 in the present example) generated by the first digital-to-digital converter 128 of the microphone assembly have been overlaid or added on the data frame structure to illustrate how the individual bits are fitted into the SoundWire data frame 200. The SoundWire data frame 200 carries the respective PDM signal samples of 5 separate microphone assemblies where frame columns 1, 2 and 3 carries the PDM signal data of the first microphone assembly (mic 1) for example the microphone assembly 100 illustrated on FIG. 1. The SoundWire data interface is configured or adapted to write a first 3-bit sample 303 of the multibit PDM signal supplied by the first microphone assembly to the adjacently arranged frame columns 1, 2 and 3 of the first frame row-row 0. The bits of the first 3-bit sample 303 are written to respective ones of the frame columns 1, 2 and 3. The number of allocated frame columns may correspond to the number of bits of each multibit sample (303, 305, 307) to optimize data density of the SoundWire data frame 200 but other embodiments may include a larger number of allocated frame columns than the number of bits of each multibit sample (303, 305, 307). After the SoundWire data interface has written the first 3-bit sample 303 of the multibit PDM signal SoundWire data frame 200, it awaits the arrival of the time slot associated with frame columns 1, 2 and 3 of the second frame row-row 1 and writes the bits (0-1-0) of the second multibit sample 305 to the data frame 200 and so forth for each successive frame row (2, 3, 4 . . . N) of the data frame 200. A corresponding data writing function to the SoundWire data bus may be carried out by each, or least some, of the residual microphone assemblies mic2, mic3, mic4, micN by their respective SoundWire data interfaces.

Figure 4:
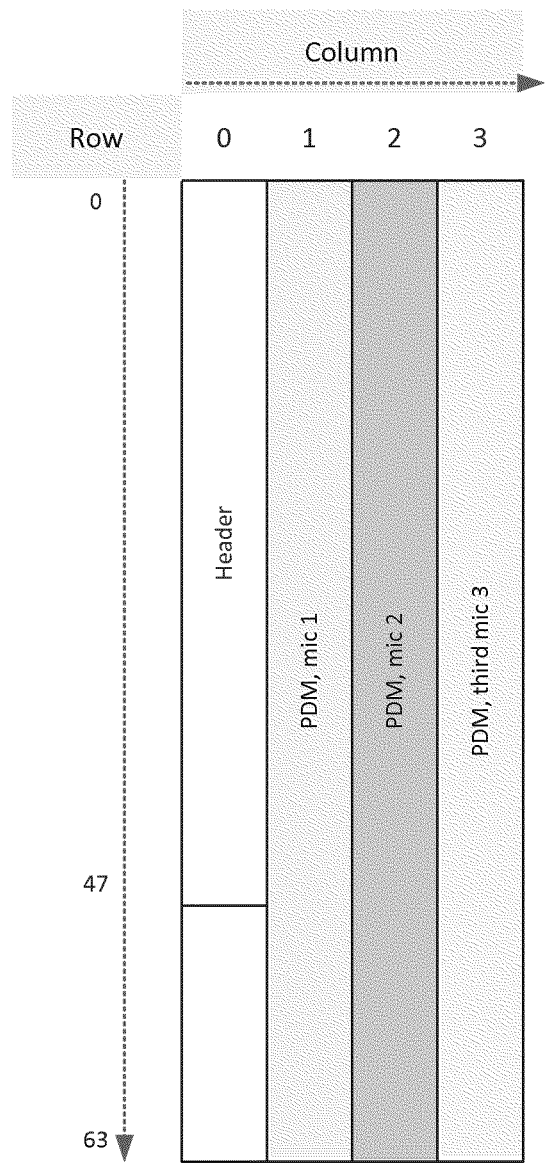
FIG. 4 shows a graphical illustration of a SoundWire data frame according to a second embodiment of the present disclosure.

FIG. 4 is a schematic illustration of a structure of an exemplary SoundWire data frame 400 in accordance with a second embodiment of the present disclosure. The SoundWire data frame 400 comprises 4 adjacently arranged frame columns 0-3 and a 64 frame rows 0-63. Each of the frame columns 1, 2 and 3 carries the respective data bits of a particular microphone assembly onto the SoundWire bus. The "sample width" of the present SoundWire data frame 400 is one as opposed to at least three for the previously discussed SoundWire data frame 200. The illustrated exemplary SoundWire data frame 400 carries respective PDM signal data of 3 separate microphone assemblies coupled to a common or shared SoundWire bus of the host processor. In FIG. 1, the SoundWire compliant data interface 120 is configured to sequentially transmit consecutive bits of each frame row onto the SoundWire data bus via the bi-directional data pad 118. In FIG. 4, once, data bits of a particular frame row have been transmitted, the interface reverts to column 0 of the subsequent frame row and transmits the data bits of the latter and so on until the entire SoundWire data frame 400 has been traversed—at column 3 and row 63 in this embodiment.

Figure 5:
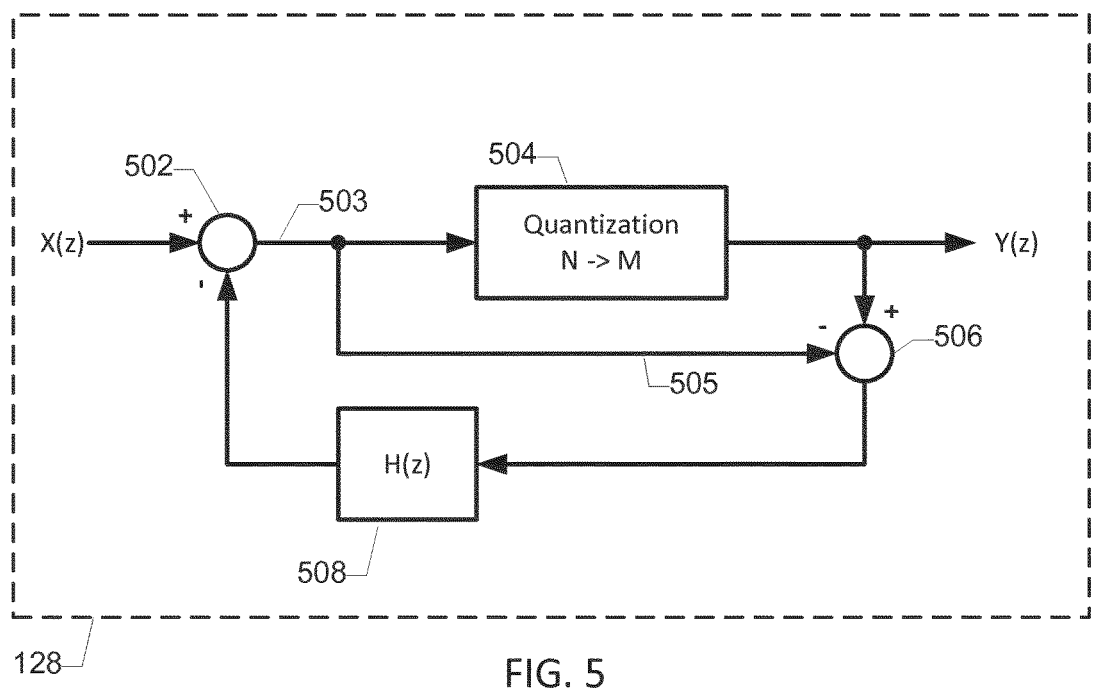
FIG. 5 shows a simplified block diagram of an exemplary embodiment of a first digital-to-digital converter suitable for use in various embodiments of the present disclosure.

FIG. 5 is a simplified block diagram of an exemplary embodiment of the first digital-to-digital converter (item 128 FIG. 1) exhibiting ultra-low latency. X(z) represents the N-bit digital microphone samples, representative of the microphone signal, supplied by the multibit analog-to-digital converter (item 104 FIG. 1) to the input of the first digital-to-digital converter. The N-bit digital microphone samples are applied to a first input of a subtractor 502 and a low pass filtered digital feedback signal is applied to a second input of the subtractor 502 such that the N-bit digital microphone samples and the low pass filtered digital feedback signal are subtracted. A residual signal 503 at the output of the subtractor 502 is applied to an input of a digital quantizer 504 which delivers a corresponding M-bit Pulse Density Modulated (PDM) signal, Y(z), where M is smaller than N, i.e., the number of bits of the incoming N-bit microphone samples X(z). As previously discussed both N and M are positive integers and. According to one embodiment, N=4 and M=1, 2, or 3. The M-bit PDM signal Y(z) is applied to a noise-shaping feedback loop comprising a second subtractor 506 and a low pass filter or integrator 508 with a transfer function H(z). The first digital-to-digital converter 128 further comprises a feedforward path 505 extending from the residual signal 503 to a second input of the second subtractor 506. The order of the low pass filter or integrator 508 may vary depending on performance requirements of a particular application and the amount of quantization performed in the digital quantizer 504, because coarser quantization generally creates more noise.

Figure 6:
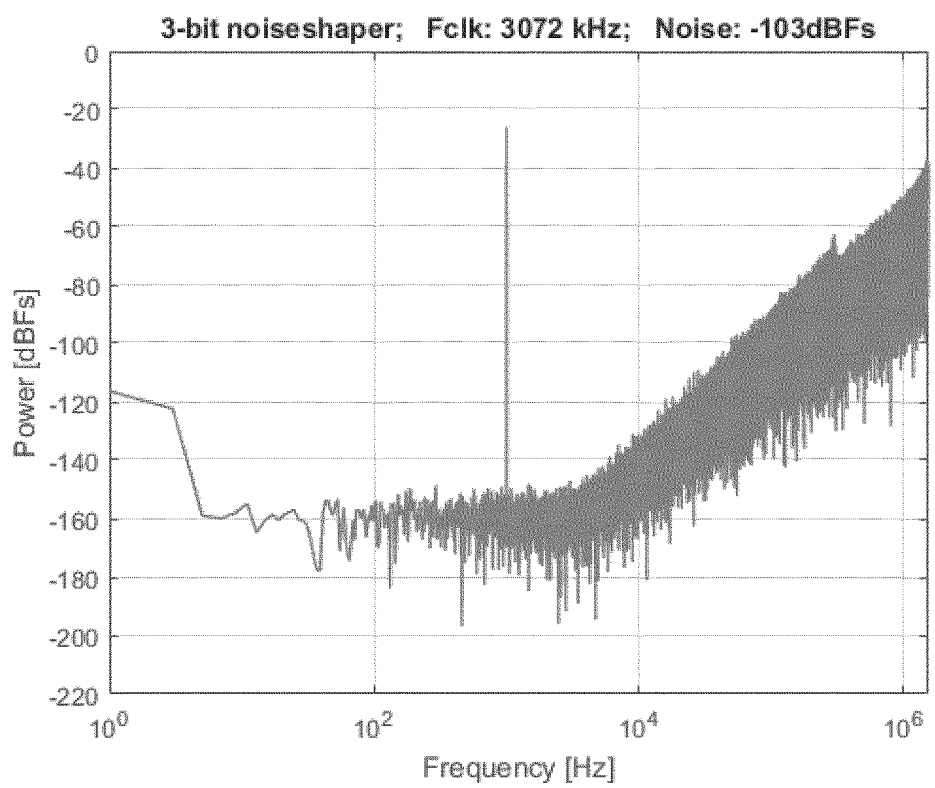
FIG. 6 illustrates a simulated noise spectrum of a first exemplary implementation of the first digital-to-digital converter.

According to one embodiment of the present disclosure, the analog-to-digital converter is configured to supply 4 bit microphone samples (N=4) and the first digital-to-digital converter 128 quantizes these to a corresponding 3 bit PDM signal. The order of the low pass filter or integrator 508 may be set to 2 or even 1 in the present embodiment of the converter 128. This low order of the integrator 508 is advantageous, because it keeps the time delay through the first digital-to-digital converter 128 very small. Generally, increasing orders of the low pass filter or integrator 508 impart larger time delays to Y(z). Hence, it is advantageous to keep a relatively low order of the integrator 508, but this is generally at the cost of an increasing level of quantization noise within the audio band (e.g., 100 Hz-10 kHz) resulting from the quantization. FIG. 6 illustrates the simulated noise spectrum and noise performance of one exemplary implementation of the present digital-to-digital converter 128 where N=4 and M=3. The order of the integrator 508 is 2 and the sampling frequency of the 4 bit microphone samples, X(z), is set to 3.072 MHz. The signal-to-noise ratio of the processing circuit 105 is approximately 103 dBFS relative to a 1 kHz full scale sine input.

The time delay of a 1 kHz audio signal through the entire microphone assembly at the 3.072 MHz device sampling frequency was measured to 1.86 µs. The 1.86 µs delay corresponds to 6 sample clock periods at 3.072 MHz. The time delay is defined as the time delay between the analog microphone signal input of the analog-to-digital converter 104 and the corresponding encoded multi-bit PDM signal at the DATA output terminal 118 of the microphone assembly. The provision of the M-bit (e.g., 3 bit) PDM signal by the microphone assembly provides a high signal-to-noise ratio simultaneously with a very small latency, e.g., about 6 sample clocks because the order of the integrator 508 may be kept low e.g., 2 or 1. For comparison purposes the inventors made a simulation of the noise performance of a corresponding digital-to-digital converter albeit with a single-bit PDM signal output. The latter exhibited a signal-to-noise ratio of about 90 dB—clearly demonstrating the value of the multibit PDM signal which exhibits a signal-to-noise ratio of 103 dB as mentioned above. The PDM bit size per sample also affects the power consumption of the data interface for transferring data, the bandwidth allocation for the device on the data interface, and ability to control the maximum amount of concurrently enabled devices on the data interface.

Figure 7:
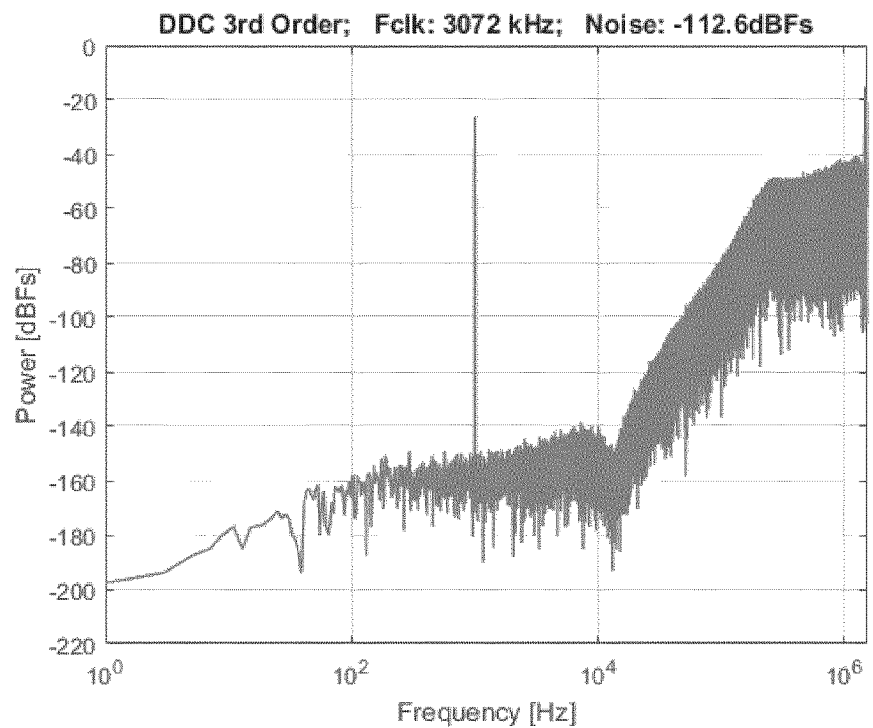
FIG. 7 illustrates a simulated noise spectrum of a second exemplary implementation of the first digital-to-digital converter generating a single-bit pulse density modulated signal.

According to another embodiment of the present disclosure, the analog-to-digital converter is configured to supply 4 bit microphone samples (N=4) and the first digital-to-digital converter 128 quantizes these to a corresponding single-bit PDM signal (i.e. M=1) similar to the operation of the previously discussed second digital-to-digital converter 126. In the latter embodiment, the order of the integrator H(z) 508 was set to 3 and 4 to compensate for the increased level of audio band quantization noise imparted by the one bit quantizer. FIG. 7 illustrates the simulated noise spectrum and noise performance of one exemplary implementation of this alternative embodiment of the first digital-to-digital converter where the order of the integrator H(z) is set to 3 while N=4 and M=1. The sampling frequency of the 4 bit microphone samples is set to 3.072 MHz as before. The signal-to-noise ratio of the first digital-to-digital converter is approximately 112 dB relative to a 1 kHz full scale sine input. However, the time delay or latency of the 1 kHz audio signal through the entire microphone assembly at the 3.072 MHz device sampling frequency was measured to 3.3 is in contrast to the 1.86 µs delay of the previous embodiment-bit with a 3 bit PDM signal. The 3.3 µs delay corresponds to 10 sample clock periods at 3.072 MHz.

Figure 8:
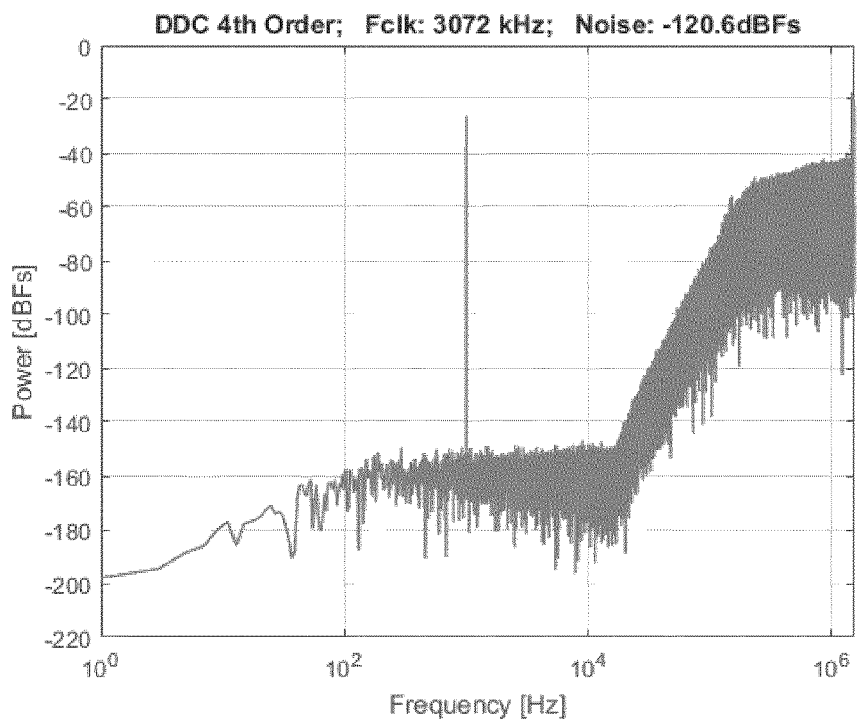
FIG. 8 illustrates a simulated noise spectrum of a third exemplary implementation of the first digital-to-digital converter generating a single-bit pulse density modulated signal.

Finally, FIG. 8 illustrates the simulated noise spectrum and noise performance of a further exemplary implementation of the first digital-to-digital converter which is identical to FIG. 7 expect for the order of the integrator H(z) which has been increased from 3 to 4. The signal-to-noise ratio of the first digital-to-digital converter is approximately 121 dB relative to a 1 kHz full scale sine input. The time delay was measured to 4.6 µs corresponding to 14 sample clock periods at 3.072 MHz and hence demonstrating the increasing time delay for increasing order of the integrator H(z) of the noise shaper.

While the disclosure and what is presently considered to be the best mode thereof has been described in a manner that establishes possession by the inventors and that enables those of ordinary skill in the art to make and use the same, it will be understood and appreciated that there are many equivalents to the embodiments disclosed herein and that myriad modifications and variations may be made thereto without departing from the scope and spirit of the invention, which is to be limited not by the exemplary embodiments but by the appended claims and their equivalents.

What is claimed is:

1. A microphone assembly comprising:
   a transducer configured to convert sound into an electrical signal; and
   an electrical circuit comprising:
      a multibit analog-to-digital converter coupled to an output of the transducer, the analog-to digital converter configured to receive, sample, and quantize the electrical signal to generate N-bit digital samples representative of the electrical signal;
      a first digital-to-digital converter including a first quantizer and a first integrator coupled to an output of the first quantizer, wherein the first digital-to-digital converter is configured to quantize and noise-shape N-bit digital samples to generate a corresponding M-bit Pulse Density Modulated (PDM) signal based on a difference between the N-bit digital samples and a first feedback signal from the first integrator, wherein N and M are positive integers and N>M;
      a processor configured to control performance of the microphone assembly by configuring the first digital-to-digital converter with configuration information stored in a register of the electrical circuit;

a control interface over which configuration information in the register is to be written and read; and
a physical interface having contacts coupled to the electrical circuit.

2. The assembly of claim 1, wherein the processor is configured to control latency of the microphone assembly by configuring an order of the first integrator using configuration information stored in the register.

3. The assembly of claim 2 further comprising a SoundWire data interface coupled to the physical interface, the SoundWire data interface configured to receive the M-bit PDM signal and write bits of the M-bit PDM signal to a data frame, wherein the control interface is a part of the SoundWire interface, and the processor is configured to access the register via the control interface.

4. The assembly of claim 2, wherein the physical interface includes a clock contact and a data contact.

5. The assembly of claim 1, wherein the processor is configured to optimize latency and a signal to noise ratio level of the microphone assembly by configuring the first digital-to-digital converter using configuration information stored in the register.

6. The assembly of claim 1, wherein the processor is configured to control a signal to noise ratio of the microphone assembly by configuring a PDM bit sample size using configuration information stored in the register.

7. The assembly of claim 1 further comprising:
a second digital-to-digital converter including a second quantizer and a second integrator coupled to an output of the second quantizer, wherein the second digital-to-digital converter is configured to quantize and noise-shape N-bit digital samples to generate a corresponding single-bit PDM signal based on a difference between the N-bit digital samples and a second feedback signal from the second integrator, wherein M>1; and
a multiplexer comprising a first input coupled to the output of the first digital-to-digital converter and a second input coupled to the output of the second digital-to-digital converter;
wherein the multiplexer is configured to selectively transmit either the single-bit PDM signal or the M-bit PDM signal to the physical interface.

8. The assembly of claim 7, wherein the order of the first integrator is not more than 2 and the order of the second integrator is not more than 4.

9. The assembly of claim 1 further comprising a housing having a lid and a substrate on which the physical interface is disposed, the transducer is a microelectromechanical systems device, wherein the transducer and the electrical circuit are disposed within the housing.

10. An electrical circuit for a microphone assembly, the electrical circuit comprising:
a multibit analog-to-digital converter configured to generate N-bit digital samples representative of an electrical signal, the electrical signal representative of acoustic activity detected by an electro-acoustic transducer;
a first digital-to-digital converter including a first quantizer and a first noise-shaping integrator coupled to an output of the first quantizer, wherein the first digital-to-digital converter is configured to quantize and noise-shape N-bit digital samples to generate a corresponding M-bit Pulse Density Modulated (PDM) signal based on a difference between the N-bit digital samples and a first feedback signal from the first noise-shaping integrator, wherein N and M are positive integers and N>M;

a processor configured to configure the first digital-to-digital converter using configuration information stored in a register of the electrical circuit; and
a control interface coupled to the register wherein configuration information is to be written to and read from the register via the control interface.

11. The circuit of claim 10, wherein the processor is configured to control latency of the electrical circuit by configuring an order of a noise-shaping feedback integrator of the first digital-to-digital converter using configuration information stored in the register.

12. The circuit of claim 11 further comprising a SoundWire data interface coupled to the output of the first quantizer, the SoundWire data interface configured to receive the M-bit PDM signal and write bits of the M-bit PDM signal to a data frame, wherein the control interface is a part of the SoundWire data interface.

13. The circuit of claim 10, wherein the processor is configured to optimize latency and a signal to noise ratio of the M-bit PDM signal by programming the first digital-to-digital converter with configuration information stored in the register.

14. The circuit of claim 10, wherein the processor is configured to control a signal to noise ratio of the M-bit PDM signal by configuring a sample size of the M-bit PDM signal, generated by the first digital-to-digital converter, using configuration information stored in the register.

15. The circuit of claim 10 further comprising:
a second digital-to-digital converter including a second quantizer and a second noise-shaping integrator coupled to an output of the second quantizer, wherein the second digital-to-digital converter is configured to quantize and noise-shape the N-bit digital samples to generate a single-bit Pulse Density Modulated (PDM) signal based on a difference between the N-bit digital samples and a second feedback signal from the second noise-shaping integrator, wherein M>1; and
a multiplexer comprising a first input coupled to the output of the first digital-to-digital converter and a second input coupled to the output of the second digital-to-digital converter, wherein the multiplexer is configured to selectively transmit either the single-bit PDM signal or the M-bit PDM signal to the data interface in response to a select input to the multiplexer.

16. The circuit of claim 15, wherein the order of the first noise-shaping integrator is not more than 2 and the order of the second noise-shaping integrator is not more than 4.

17. A method in an acoustic microphone assembly comprising a transducer and an electrical circuit disposed in a housing having a physical interface, the method comprising:
converting sound into an electrical signal using the transducer;
generating N-bit digital samples representative of the electrical signal using an analog-to-digital converter of the electrical circuit;
generating a M-bit Pulse Density Modulated (PDM) signal, where N and M are positive integers and N>M, by quantizing and noise-shaping N-bit digital samples using a first digital-to-digital converter;
controlling performance of the microphone assembly by configuring the first digital-to-digital converter with configuration information read from a register of the microphone assembly; and
providing a PDM signal to the physical interface.

18. The method of claim 17 controlling performance includes controlling processing latency by configuring an order of a noise-shaping feedback integrator with configuration information read from the register.

19. The method of claim 18, writing configuration information to the register via a control interface that is part of a SoundWire data interface.

20. The method of claim 17 controlling performance includes optimizing latency and a signal to noise ratio of the M-bit PDM signal by programming the first digital-to-digital converter with configuration information read from the register.

21. The method of claim 17, controlling performance includes controlling a signal to noise ratio of the M-bit PDM signal by configuring a sample size of the M-bit PDM signal using configuration information read from the register.

22. The method of claim 17 further comprising:
generating a single-bit PDM signal by quantizing and noise-shaping N-bit digital samples using a second digital-to-digital converter, wherein M>1; and
controlling the performance of the electrical circuit includes controlling a signal to noise ratio of the PDM signal provided to the physical interface by selectively providing either the M-bit PDM signal or the single-bit PDM signal to the physical interface.

* * * * *